US012597935B2

(12) United States Patent
Toshikawa et al.

(10) Patent No.: US 12,597,935 B2
(45) Date of Patent: Apr. 7, 2026

(54) LOOP FILTER USED IN PLL, AND PLL

(71) Applicant: Socionext Inc., Kanagawa (JP)

(72) Inventors: Taku Toshikawa, Yokohama (JP); Heiji Ikoma, Yokohama (JP); Naoshi Yanagisawa, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 36 days.

(21) Appl. No.: 18/945,108

(22) Filed: Nov. 12, 2024

(65) Prior Publication Data

US 2025/0070787 A1     Feb. 27, 2025

Related U.S. Application Data

(63) Continuation of application No. PCT/JP2022/020255, filed on May 13, 2022.

(51) Int. Cl.
H03L 7/093     (2006.01)
H03L 7/099     (2006.01)
H03L 7/18      (2006.01)
*H03L 7/089*      (2006.01)

(52) U.S. Cl.
CPC ............ H03L 7/093 (2013.01); H03L 7/0995 (2013.01); H03L 7/18 (2013.01); *H03L 7/0891* (2013.01)

(58) Field of Classification Search
CPC ......... H03L 7/093; H03L 7/0995; H03L 7/18; H03L 7/0891; H03L 7/107; H03H 21/0001; H03H 21/0003; H03H 21/0007; H03H 21/0012; H03H 7/0138; H03H 7/0153; H03H 11/00; H03H 11/0466; H03H 11/1204; H03K 5/1252
See application file for complete search history.

(56) References Cited

U.S. PATENT DOCUMENTS

| | | | |
|---|---|---|---|
| 6,127,880 A | 10/2000 | Holst et al. | |
| 2006/0119444 A1* | 6/2006 | Horan | H03L 7/093 |
| | | | 331/17 |
| 2010/0052747 A1 | 3/2010 | Sugano et al. | |

FOREIGN PATENT DOCUMENTS

| | | |
|---|---|---|
| JP | H09-307437 A | 11/1997 |
| JP | 2000-040960 A | 2/2000 |
| JP | 2008-219799 A | 9/2008 |
| WO | 2014/031787 A1 | 2/2014 |

OTHER PUBLICATIONS

International Search Report dated Jul. 26, 2022 issued in International Patent Application No. PCT/JP2022/020255, with English translation.

* cited by examiner

*Primary Examiner* — Jung Kim
(74) *Attorney, Agent, or Firm* — Rimon P.C.

(57)     ABSTRACT

A loop filter includes: an input terminal and an output terminal mutually connected via a first node; a filter unit; and a low pass filter provided between a second power supply terminal and a third power supply node. One or more of at least one first resistive element and at least one first capacitive element constituting the filter unit are provided between the first node and a first power supply terminal via a switch part, and at least either the resistance value or the capacitance value of the filter unit is variable with on/off of the switch part. The switch part is constituted by transistors, and the backgate of at least one of the transistors is connected to the third power supply node.

11 Claims, 7 Drawing Sheets

LOOP FILTER USED IN PLL, AND PLL

CROSS-REFERENCE TO RELATED APPLICATIONS

This is a continuation of International Application No. PCT/JP2022/020255 filed on May 13, 2022. The entire disclosure of this application is incorporated by reference herein.

BACKGROUND

The present disclosure relates to a loop filter used in a phase locked loop (PLL) and a PLL using the same.

A loop filter used in a PLL has a function as a low pass filter that converts the comparison result of a phase comparison circuit into an analog voltage. The analog voltage output from the loop filter is input into a voltage controlled oscillator (VCO), and the VCO generates a periodical oscillation signal corresponding to the analog voltage.

In recent years, with the increasing speed of semiconductor integrated circuits, a PLL is being required to respond to a wide input frequency range and generate a high-speed, low-jitter clock in a wide output frequency range.

Japanese Unexamined Patent Publication No. 2000-040960 presents a configuration example of a PLL in which the constants (resistance value and capacitance value) of a loop filter are made switchable using a switch constituted by a MOS transistor.

Although illustration is omitted in the cited document, the backgate of the MOS transistor constituting the switch is generally connected to the ground potential. In such a configuration, if the ground has noise, the noise will be mixed in the output node of the loop filter, i.e., the input node of a VCO, due to capacitance coupling, causing fluctuations in the oscillating frequency of the VCO.

Also, in this configuration, if the power supply has noise, the noise of the power supply will enter the source of a power-to-current conversion transistor (VtoI transistor) used as a current source of the VCO. On the other hand, the backgate of the MOS transistor constituting the switch is connected to the ground. This indicates that the noise to the output node of the loop filter, i.e., the input node of the VCO, which is connected to the gate of the VtoI transistor, is different from the noise to the source of the VtoI transistor in phase and amplitude. This will cause fluctuations in the output current of the current source of the VCO and then fluctuations in the oscillating frequency of the VCO.

In view of the problem described above, an objective of the present disclosure is implementing a loop filter having a constant switchable function that is little affected by noise mixed in the ground or the power supply, and a PLL using such a loop filter.

SUMMARY

According to one mode of the present disclosure, a loop filter used for a PLL, includes: an input terminal and an output terminal mutually connected via a first node; a filter unit provided between the first node and a first power supply terminal, the filter unit including at least one first resistive element, at least one first capacitive element, and a switch part; and a low pass filter provided between a second power supply terminal and a third power supply node, wherein one or more of the at least one first resistive element and the at least one first capacitive element are provided between the first node and the first power supply terminal via the switch part, and at least either a resistance value or a capacitance value of the filter unit is variable with on/off of the switch part, and the switch part is constituted by transistors, and a backgate of at least one of the transistors is connected to the third power supply node.

According to the above mode, since at least either the resistance value or the capacitance value of the filter unit is made variable with on/off of the switch part, the loop filter can respond to a wider input frequency range and a wider output frequency range. Also, the low pass filter is provided between the second power supply terminal and the third power supply node, and the backgate of at least one of transistors constituting the switch part is connected to the third power supply node. This can prevent fluctuations in the output voltage of the loop filter due to noise present on the second power supply terminal. As a result, fluctuations in the oscillating frequency of a PLL using the loop filter can be prevented.

According to the loop filter of the present disclosure, while the input frequency range and the output frequency range of a PLL using the loop filter can be widened, fluctuations in oscillating frequency due to power supply noise can be prevented.

BRIEF DESCRIPTION OF THE DRAWINGS

FIG. 1 is a block diagram showing a configuration example of a PLL.

FIG. 4 is a circuit diagram showing another configuration example of a variable section.

DETAILED DESCRIPTION

Figure 2:
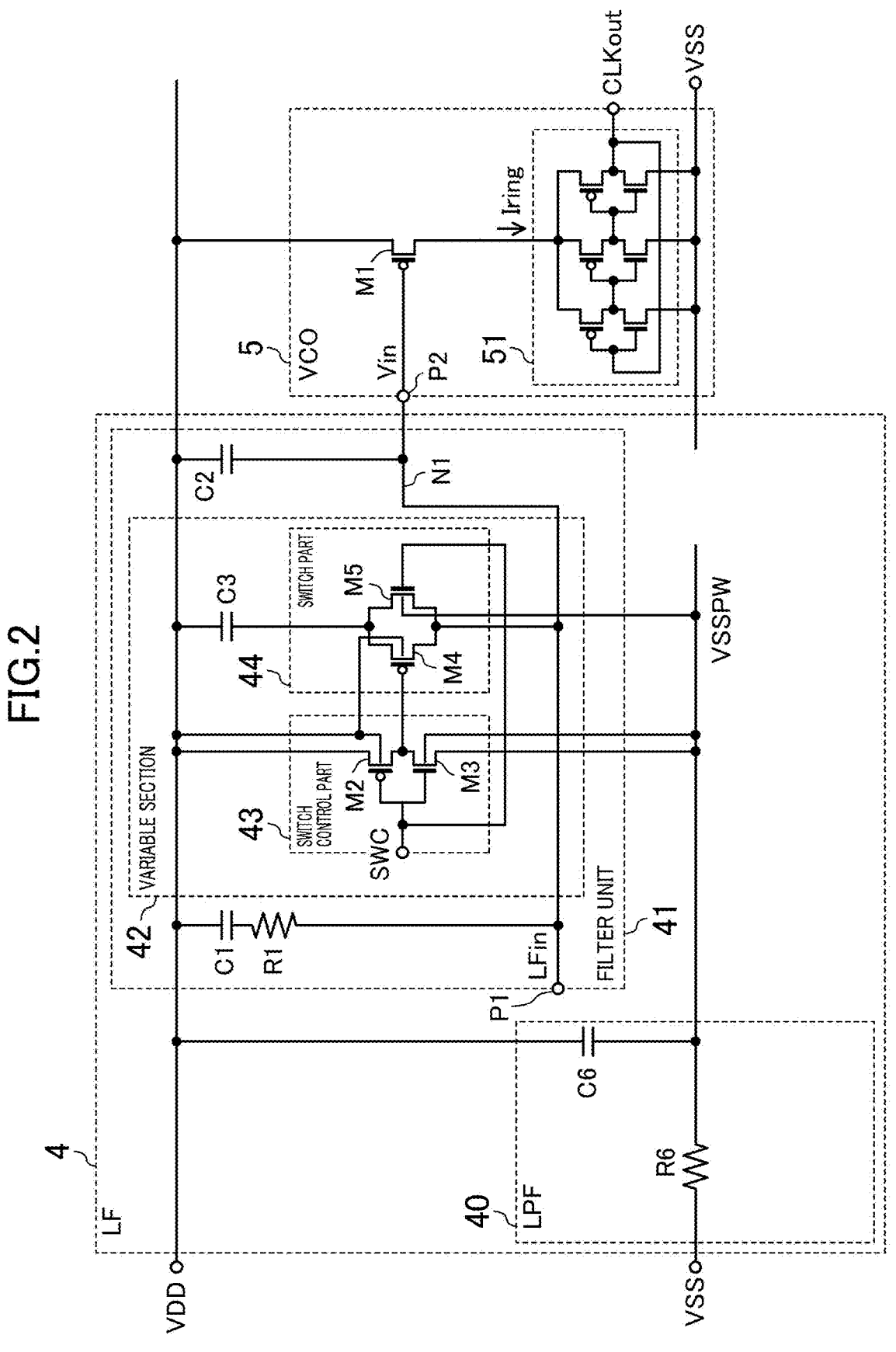
FIG. 2 is a circuit diagram showing a configuration example of a loop filter and a VCO.

An embodiment of the present disclosure will be described hereinafter. Note that specific circuit configurations and the like demonstrated in the following embodiment are mere examples for easy understanding of the present disclosure and by no means intended to limit the range of the disclosure. Note also that, in the following description, a node of a circuit and a signal or a current passing through the node or a voltage at the node may be denoted by the same reference character. Also, a power supply and its corresponding power supply node, power supply terminal, and power supply voltage may be denoted by the same reference character.

—Configuration of PLL—

Figure 1:
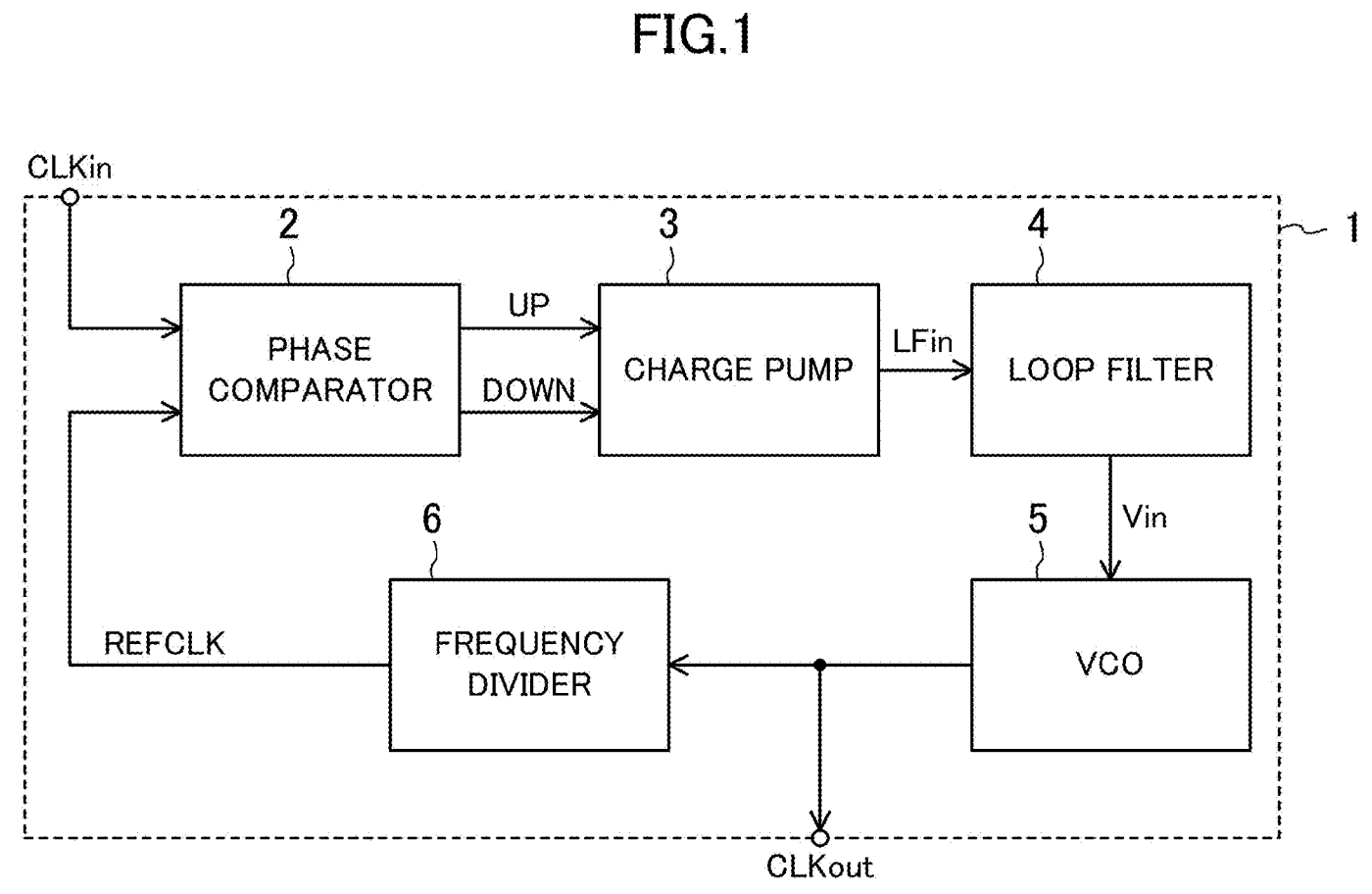

As shown in FIG. 1, a PLL 1 includes a phase comparator 2, a charge pump 3, a loop filter 4, a voltage controlled oscillator (VCO) 5, and a frequency divider 6.

The phase comparator 2 receives an external clock signal CLKin as an externally input reference clock and a feedback clock signal REFCLK output from the frequency divider 6, and compares the frequencies and phases of the two clock signals with each other. The phase comparator 2 then activates an UP signal when the frequency of the feedback clock signal REFCLK is higher than the frequency of the external clock signal CLKin, and activates a DOWN signal when the former is lower than the latter.

The charge pump 3 receives the UP signal or the DOWN signal output from the phase comparator 2 and performs charge pumping operation.

The loop filter 4 receives a signal LFin output from the charge pump 3, converts the signal LFin into a control voltage Vin, and outputs the voltage. Specific circuit configuration examples of the loop filter 4 will be described later.

The VCO 5 oscillates at a frequency corresponding to the control voltage Vin output from the loop filter 4 and outputs an output signal CLKout. Specific circuit configuration examples of the VCO 5 will be described later.

The frequency divider 6 receives the output signal CLKout output from the VCO 5, divides the frequency at an arbitrarily set ratio, and outputs the result as the feedback clock signal REFCLK.

—Configuration of Loop Filter—

FIG. 2 is a circuit diagram showing a configuration example of the loop filter 4 and the VCO 5.

As shown in FIG. 2, the loop filter 4 includes a low pass filter 40 and a filter unit 41. An input terminal P1 and an output terminal P2 of the loop filter 4 are connected via a first node N1.

(Low Pass Filter)

The low pass filter 40 is provided between a ground terminal VSS (corresponding to the second power supply terminal) and a power supply node VSSPW. The power supply node VSSPW is isolated from a ground node VSS connected to the ground terminal VSS. Specifically, the power supply node VSSPW is isolated from ground nodes VSS connected to the other components of the PLL 1, e.g., a ground node VSS connected to the VCO 5.

In the example of FIG. 2, the low pass filter 40 includes: a resistive element R6 provided between the ground terminal VSS and the power supply node VSSPW; and a capacitive element C6 provided between a power supply terminal VDD and the power supply node VSSPW. The resistive element R6 corresponds to the second resistive element and the capacitive element C6 corresponding to the second capacitive element.

The configuration of the low pass filter 40 is not limited to the configuration in FIG. 2, but can be changed to another configuration having a similar function. For example, at least either the resistance value or the capacitance value of the low pass filter 40 may be made variable. Specifically, in an example of FIG. 3, a serial circuit of a resistive element R62 and a transistor M62 is provided in parallel with the resistive element R6, and a serial circuit of a capacitive element C61 and a transistor M61 is provided in parallel with the capacitive element C6. With this, the constants of the low pass filter 40 can be changed with on/off of the transistors M61 and M62. This makes it possible to obtain optimum LPF characteristics in response to noise, and therefore effectively prevent noise from the ground terminal VSS, whereby fluctuations in the oscillating frequency of the VCO 5 can be prevented more effectively.

(Filter Unit)

The filter unit 41 includes at least one resistive element and at least one capacitive element provided between the first node N1 and the power supply terminal VDD (corresponding to the first power supply terminal). The filter unit 41 also includes a variable section 42 that makes variable at least either the resistance value of the resistive element or the capacitance value of the capacitive element.

One or more of the at least one resistive element and the at least one capacitive element are provided in the variable section 42, and some or all of the remainder are directly connected between a power supply node VDD and the first node N1.

In the example of FIG. 2, a capacitive element C3 is provided in the variable section 42. A serial circuit of a capacitive element C1 and a resistive element R1 is connected between the power supply node VDD and the first node N1, and a capacitive element C2 is connected between the power supply node VDD and the first node N1. The capacitive element C3 corresponds to the third capacitive element, the capacitive element C1 corresponds to the fourth capacitive element, and the capacitive element C2 corresponds to the fifth capacitive element.

In other words, the serial circuit of the capacitive element C1 and the resistive element R1, a serial circuit of the capacitive element C3 and a switch part 44, and the capacitive element C2 are connected in parallel between the power supply node VDD and the first node N1. And, with on/off of the switch part 44, at least either the resistance value or the capacitance value of the filter unit 41 can be made variable. In the example of FIG. 2, the capacitance value of the filter unit 41 can be made variable.

The variable section 42 includes a switch control part 43 and the switch part 44 in addition to the one or more of the resistive element and the capacitive element described above.

The switch part 44 has a function of determining, by switching, whether the resistive element and/or the capacitive element provided in the variable section 42 should be added to the loop filter 4 or detached from the loop filter 4.

In the example of FIG. 2, with on/off of the switch part 44, switching can be made on whether the capacitive element C3 should be connected between the power supply node VDD and the first node N1, or detached from the loop filter 4. In other words, FIG. 2 shows a configuration example in which the capacitance value of the filter unit 41 is made adjustable with on/off of the switch part 44.

The switch part 44 is constituted by transistors, and the backgate of at least one of the transistors is connected to the power supply node VSSPW (corresponding to the third power supply node). In the example of FIG. 2, the switch part 44 is constituted by two transistors M4 and M5. In the p-type transistor M4, the source is connected to the capacitive element C3, the drain is connected to the first node N1, and the backgate is connected to the power supply node VDD. In the n-type transistor M5, the drain is connected to the capacitive element C3, the source is connected to the first node N1, and the backgate is connected to the power supply node VSSPW.

The switch control part 43 turns on/off the switch part 44 based on a switch control signal SWC. The switch control signal SWC is input from outside the PLL 1, for example. In the example of FIG. 2, the switch control part 43 includes an inverter constituted by transistors M2 and M3. The switch control signal SWC is given to the input of the inverter, and the output of the inverter is given to the gate of the transistor M4. The switch control signal SWC is also given to the gate of the transistor M5. In the p-type transistor M2, the source is connected to the power supply node VDD, the drain is connected to the drain of the transistor M3 and to the gate of the transistor M4, and the backgate is connected to the power supply node VDD. In the n-type transistor M3, the source and the backgate are connected to the power supply node VSSPW.

Note that only the backgate of the transistor M5 constituting the switch part 44 may be connected to the power supply node VSSPW. In this case, the source and backgate of the transistor M3 are to be connected to the ground node VSS.

A triple-well structure is used for the loop filter 4. That is, the P-well on which the n-type transistors constituting the switch part 44 and the switch control part 43 are formed is isolated from a P-well or a P-substrate on which the other n-type transistors of the loop filter 4 are formed.

—Configuration of VCO—

The VCO 5 includes: a transistor M1 that generates an operating current Iring from the control voltage Vin; and a ring oscillator 51. The ring oscillator 51 changes the oscillating frequency of the output signal CLKout in response to the operating current Iring.

Note that, on the substrate of a semiconductor integrated circuit including the PLL 1, a VDD line constituting the power supply node VDD is laid between a transmission line through which the control voltage Vin is transmitted and a VSS line constituting the ground node VSS. With this laying, the VDD line functions as a shield line between the transmission line and the VSS line. Also, even if power supply noise enters the VDD line due to crosstalk from the VSS line, no problem will arise on the operation of the PLL 1, as described in "Operation (1) of PLL" to follow.

Next, an operation example of the PLL will be described.

—Operation (1) of PLL—

A case where power supply noise is present on the power supply terminal VDD will be described hereinafter referring to the circuit of FIG. 2.

As described above, in the loop filter 4, due to the capacitive coupling by the capacitive elements C1, C2, and C3 provided between the power supply node VDD and the first node N1, the end-to-end potential difference between the power supply terminal VDD and the output terminal P2 is retained. Therefore, power supply noise same in phase and amplitude as that on the power supply voltage VDD enters the control voltage Vin. Also, as described above, the source of the transistor M1 for supply of a current to the VCO 5 is connected to the power supply node VDD. Therefore, no fluctuations caused by the power supply noise occur in the gate-source voltage Vgs of the transistor M1. As a result, with no fluctuations occurring in the operating current Iring supplied from the transistor M1 to the ring oscillator 51, the oscillating frequency of the VCO 5 does not fluctuate either.

It is considered that, when the power supply node VDD and the first node N1 are adjacent to each other, crosstalk between the lines may occur. In this case, also, no problem will arise since the first node N1 only has noise same in phase and amplitude caused by the power supply noise.

—Operation (2) of PLL—

A case where ground noise is present on the ground terminal VSS will be described hereinafter referring to the circuit of FIG. 2.

As described above, since the low pass filter 40 is provided between the ground terminal VSS and the power supply node VSSPW, the ground noise is reduced before being supplied to the power supply node VSSPW. Therefore, there is no influence of the ground noise on the backgate of the transistor M5 of the switch part 44 and the source and backgate of the transistor M3 of the switch control part 43. As a result, with no fluctuations occurring in the control voltage Vin due to ground noise, the oscillating frequency of the VCO 5 does not fluctuate either.

Also, as described above, since the VDD line constituting the power supply node VDD is laid between the transmission line through which the control voltage Vin is transmitted and the VSS line constituting the ground node VSS, ground noise is prevented from entering the control voltage Vin due to crosstalk.

As described above, in both cases where power supply noise is present on the power supply terminal VDD and where ground noise is present on the ground terminal VSS, there are no noise-caused fluctuations in the oscillating frequency of the VCO 5. Therefore, while the PLL 1 is made able to respond to a wide input frequency range and a wide output frequency range by making the constants of the loop filter 4 variable, fluctuations in oscillating frequency due to power supply noise and/or ground noise can be prevented.

—Other Embodiments—

While the example of constituting the switch part 44 by the p-type transistor M4 and the n-type transistor M5 is described in the above embodiment, the configuration is not limited to this. For example, the switch part 44 may be constituted by only n-type transistors although illustration is omitted. In this case, the backgates of all the n-type transistors of the switch part 44 are to be connected to the power supply node VSSPW.

While the variable section 42 includes only one capacitive element C3 in the above embodiment, the configuration is not limited to this.

Figure 4:
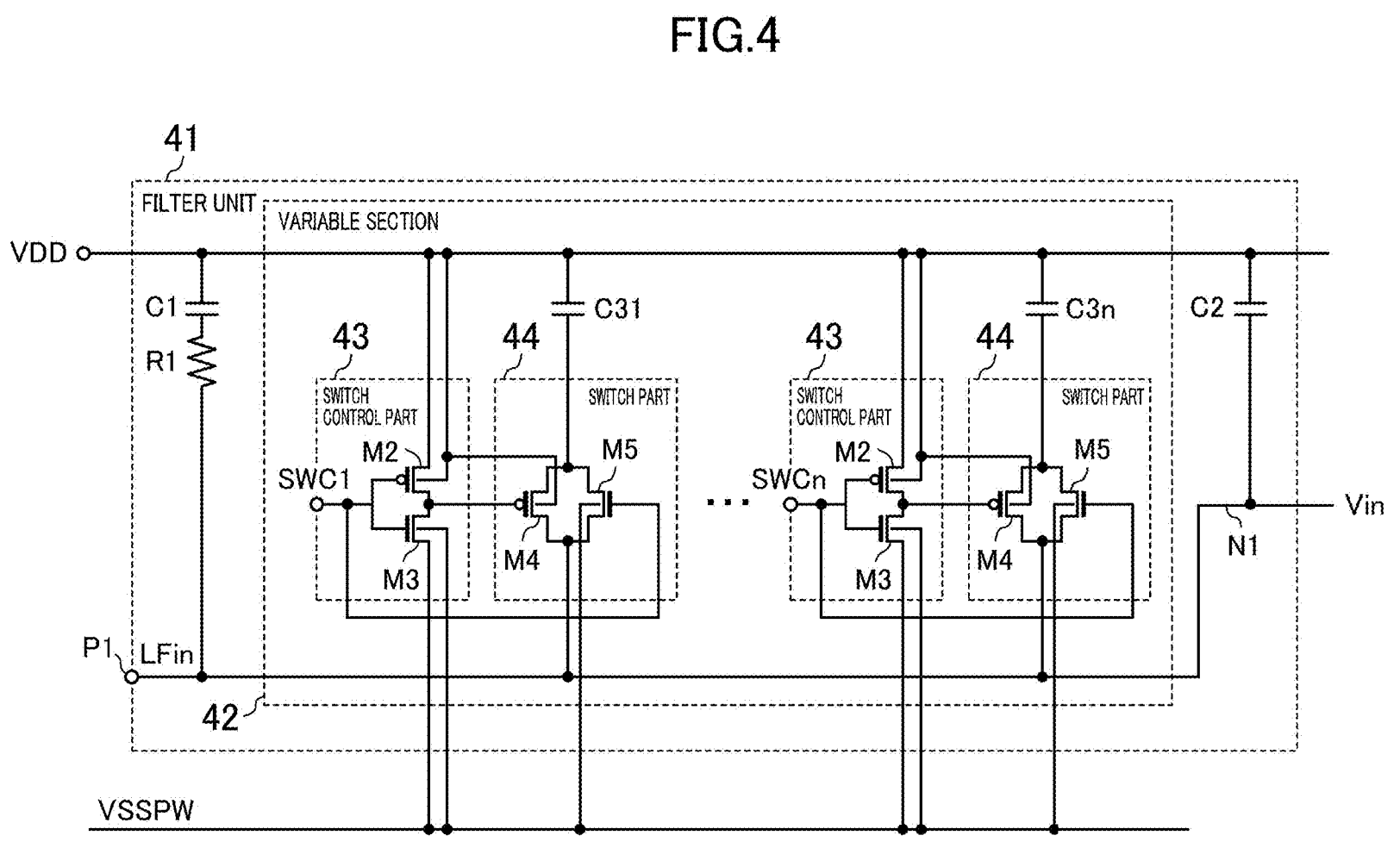

For example, as shown in FIG. 4, a plurality of capacitive elements C31 to C3n (n is an integer equal to or more than 2) may be provided in the variable section 42. The capacitive elements C31 to C3n may have individual switch parts 44, and whether each of the capacitive elements should be added to or detached from the loop filter 4 may be made switchable based on corresponding switch control signals SWC1 to SWCn different from one another. In this case, also, the backgate of the transistor M5 of each switch part 44 and the source and backgate of the transistor M3 of each switch control part 43 are connected to the power supply node VSSPW. Having this configuration, it is possible to respond to a wider input frequency range and/or a wider output frequency range, in addition to having the effects described in the above embodiment.

Figure 5:
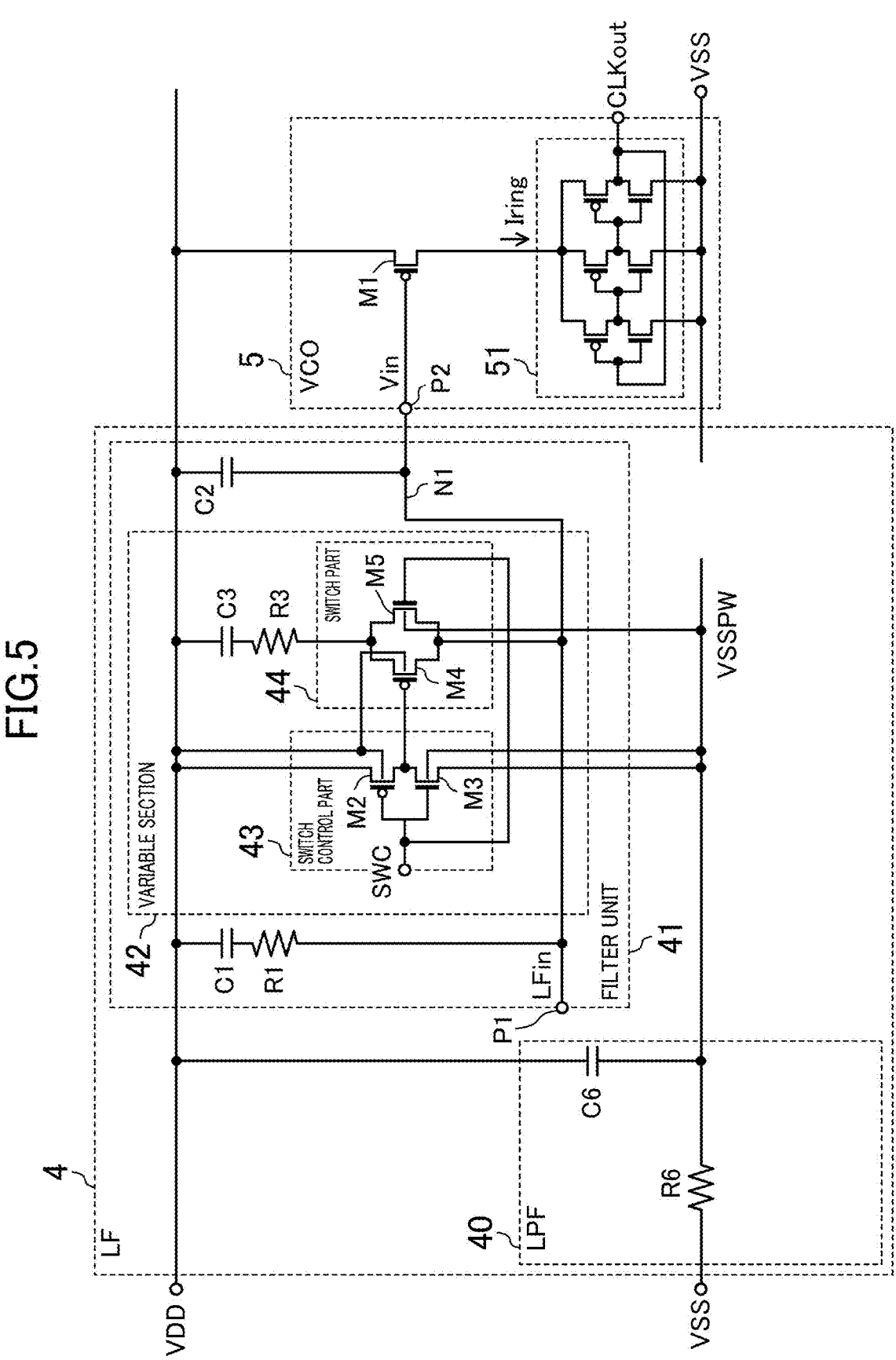
FIG. 5 is a circuit diagram showing yet another configuration example of the loop filter and the VCO.

Also, as shown in FIG. 5, for example, the variable section 42 may include a resistive element R3 and the capacitive element C3. Specifically, in the example of FIG. 5, the resistive element R3 is provided between the capacitive element C3 and the source of the transistor M4/the drain of the transistor M5 of the switch part 44, in addition to the circuit of FIG. 2. In this case, also, effects similar to those in the above embodiment are obtained. Note that, although the capacitive elements C3 in FIGS. 2 and 5 are denoted by the same reference character for convenience of description, it is not intended to limit these capacitive elements to have the same configuration and/or capacitance value. This also applies to other components. Also, in FIG. 5, the resistive element R1 corresponds to the fourth resistive element and the resistive element R3 corresponds to the third resistive element.

As an alteration of the configuration of FIG. 5, as in FIG. 4, a plurality of capacitive elements C31 to C3n (n is an integer equal to or more than 2) and a plurality of resistive elements R31 to R3n (not shown) may be provided in the variable section 42. Specifically, the resistive elements R31 to R3n may be respectively provided between the capacitive elements C31 to C3n and the switch parts 44, 44, . . . . Having this configuration, it is possible to respond to a wider input frequency range and a wider output frequency range, in addition to having the effects described in the above embodiment.

Figure 6:
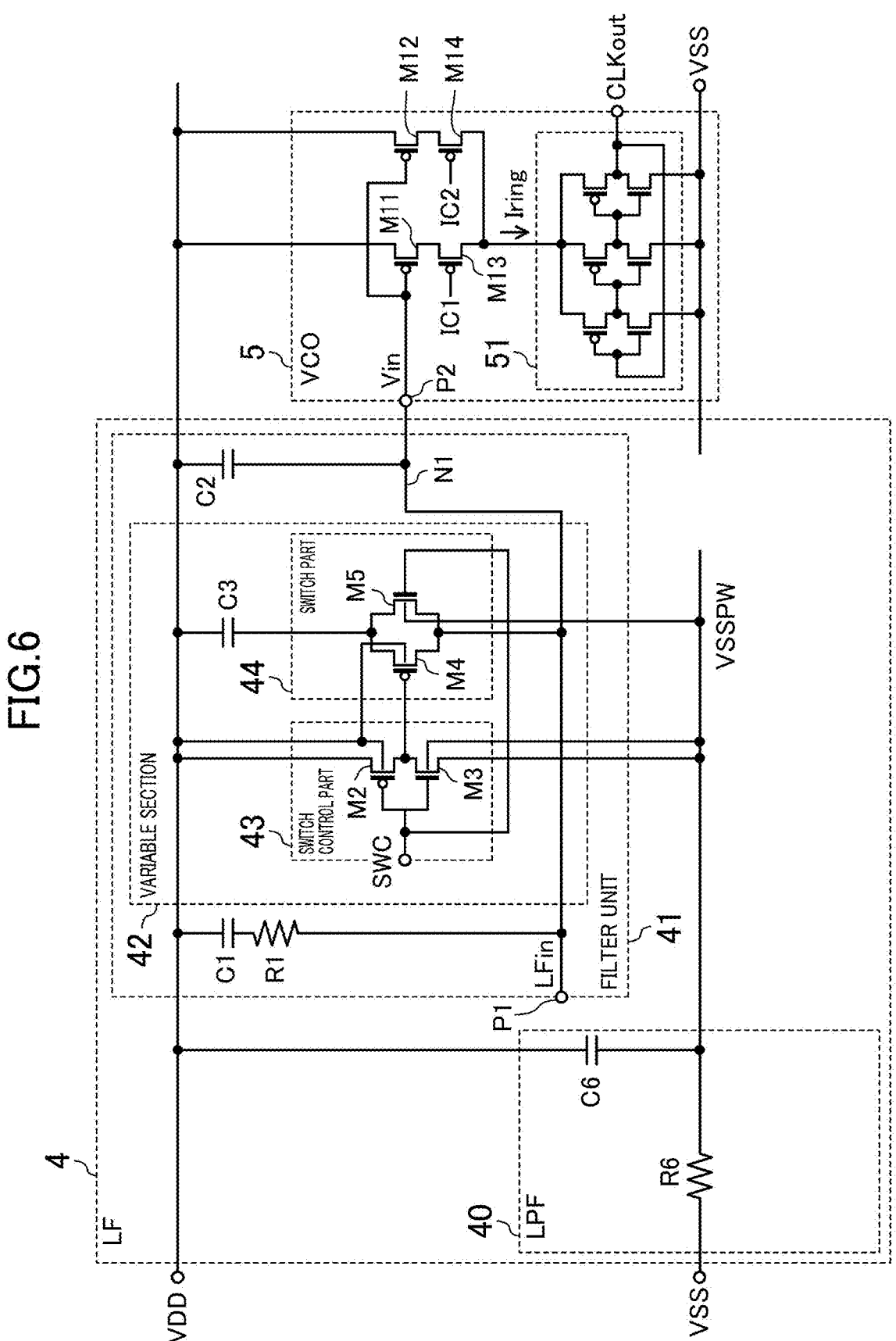
FIG. 6 is a circuit diagram showing yet another configuration example of the loop filter and the VCO.

In the VCO 5 in the above embodiment, a plurality of transistors (VtoI transistors) for generating the operating current Iring from the control voltage Vin may be provided in parallel to make the operating current Iring adjustable. FIG. 6 shows an example having two transistors M11 and M12 that generate the operating current Iring from the control voltage Vin. Also, a transistor M13 that is turned on/off with a current control signal IC1 is provided between the transistor M11 and the ring oscillator 51, and a transistor M14 that is turned on/off with a current control signal IC2 is provided between the transistor M12 and the ring oscillator 51. Having this configuration, the oscillating frequency range of the VCO 5 can be changed with on/off of the transistor M13 and/or the transistor M14, and therefore the output frequency range the PLL 1 can respond to can be widened. Note that, while two VtoI transistors M11 and M12 are connected in parallel in the example of FIG. 6, three or more VtoI transistors may be connected in parallel. This will make it possible to widen the current adjustment range and perform fine current adjustment.

Figure 7:
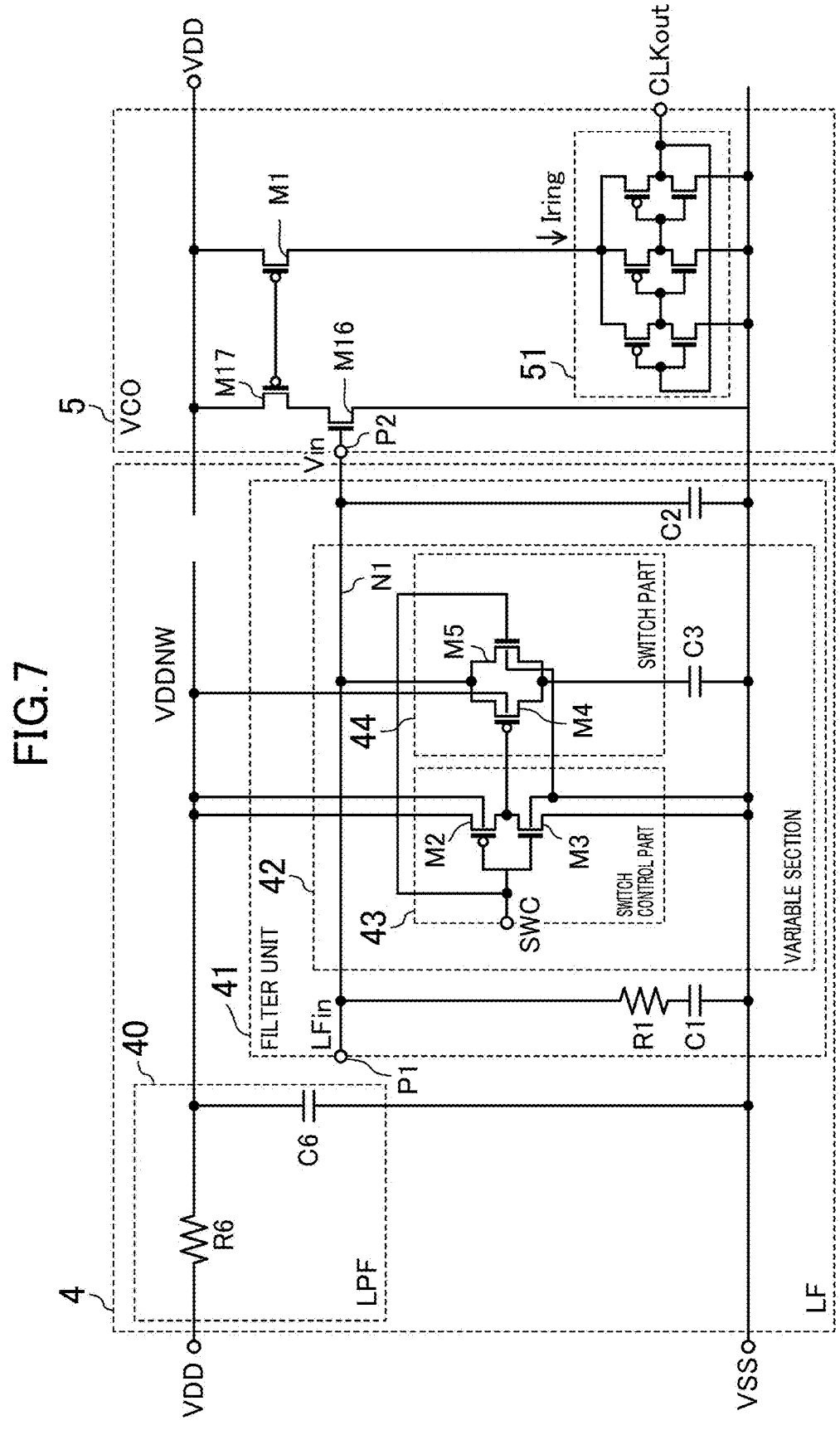
FIG. 7 is a circuit diagram showing yet another configuration example of the loop filter and the VCO.

FIG. 7 shows an example in which the power supply and the ground are inverted from those in the circuit of FIG. 2. In FIG. 7, for convenience of description, components corresponding to those in FIG. 2 are denoted by the same reference characters, and description here will be made focusing on differences between them.

In the loop filter 4, the low pass filter 40 is provided between the power supply terminal VDD (corresponding to the second power supply terminal) and a power supply node VDDNW (corresponding to the third power supply node), and the filter unit 41 is provided between the first node N1 and the ground terminal VSS (corresponding to the first power supply terminal).

In the low pass filter 40, the resistive element R6 is provided between the power supply terminal VDD and the power supply node VDDNW.

In the filter unit 41, a serial circuit of the resistive element R1 and the capacitive element C1, a serial circuit of the switch part 44 and the capacitive element C3, and the capacitive element C2 are connected in parallel between the first node N1 and the ground node VSS. In the switch control part 43, the source and backgate of the p-type transistor M2 constituting an inverter are connected to the power supply node VDDNW. The backgate of the transistor M3 constituting the inverter is connected to the ground node VSS. In the switch part 44, the p-type transistor M4 receiving the output of the switch control part 43 is connected to the first node N1 at its source, to the capacitive element C3 at its drain, and to the power supply node VDDNW at its backgate. The n-type transistor M5 receiving the switch control signal SWC at its gate is connected to the first node N1 at its drain, to the capacitive element C3 at its source, and to the ground node VSS at its backgate.

In the VCO 5, the gate of an n-type transistor M16 is connected to the output terminal P2 of the loop filter 4. The n-type transistor M16 is connected to the ground node VSS at its source and to the drain of a p-type transistor M17 at its drain. The transistor M17 is connected to the power supply node VDD at its source and to the gate of the transistor M1 for supply of the operating current Iring at its gate.

The PLL 1 including the loop filter 4 and the VCO 5 of FIG. 7 also operates as described in the above embodiment and can obtain similar effects. Specifically, when noise is present on the power supply terminal VDD, the power supply noise is reduced by the low pass filter 40, and therefore, there is no influence of the power supply noise on the backgate of the transistor M4 of the switch part 44 and the source and backgate of the transistor M2 of the switch control part 43. When ground noise is present on the ground terminal VSS, ground noise same in phase and amplitude as that on the ground VSS enters the control voltage Vin, as in the above embodiment. Therefore, no fluctuations caused by power supply noise occur at the gate-source voltage Vgs of the transistor M1. As a result, with no fluctuations occurring in the operating current Iring supplied from the transistor M1 to the ring oscillator 51 of the VCO 5, the oscillating frequency of the VCO 5 does not fluctuate either.

Figure 3:
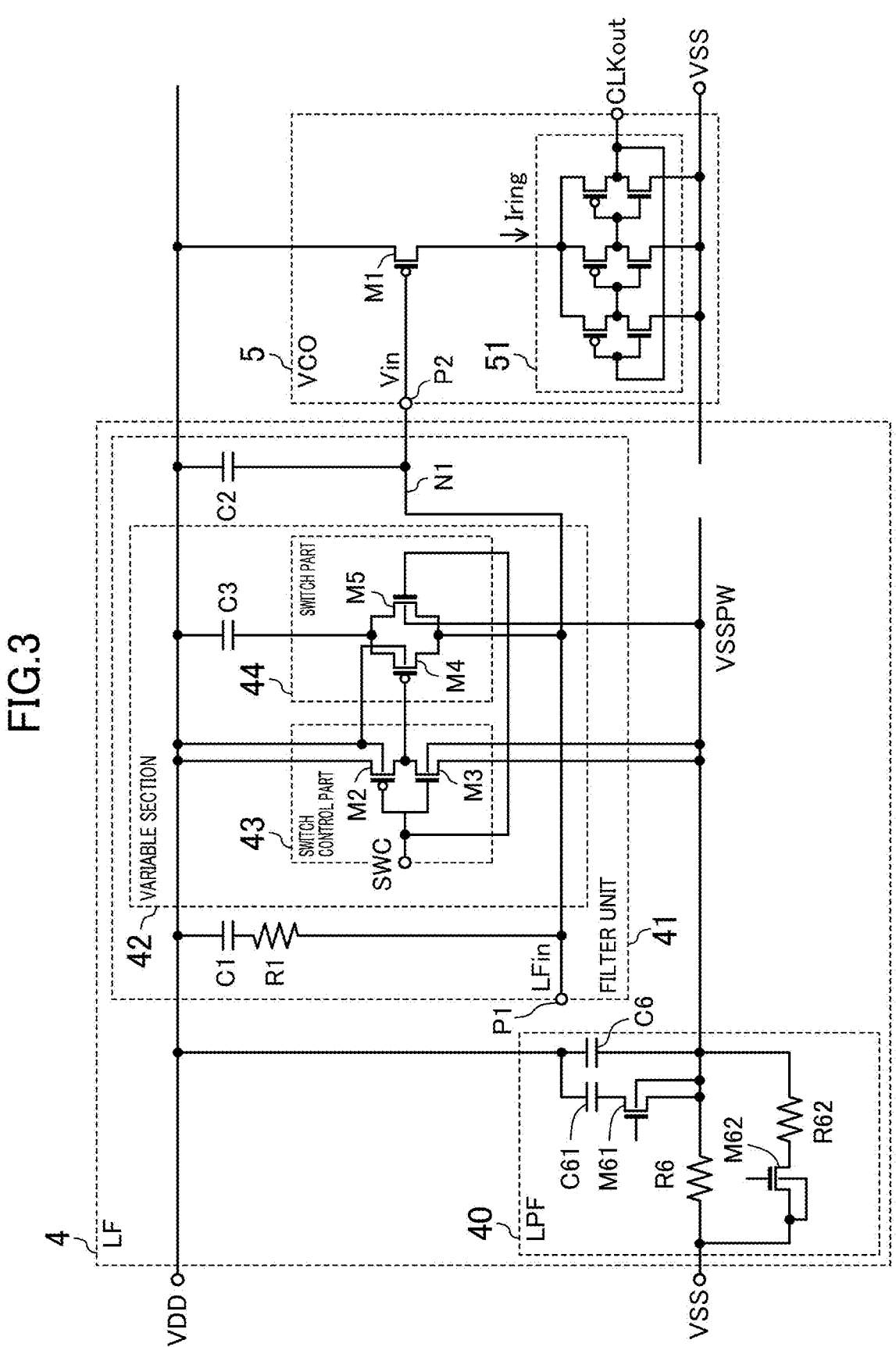
FIG. 3 is a circuit diagram showing another configuration example of the loop filter and the VCO.

Note that part or all of the configurations added in FIGS. 3, 5, and 6 may be added to the circuit of FIG. 7, and similar effects will be obtained. In FIG. 7, the well for the p-type transistors in the filter unit 41 is isolated from a well for p-type transistors in the other portion. Specifically, the N-well on which the p-type transistors constituting the switch part 44 and the switch control part 43 are formed is isolated from an N-well on which the other p-type transistors of the loop filter 4 are formed.

In the above embodiment, while the VDD line constituting the power supply node VDD is laid between the transmission line through which the control voltage Vin is transmitted and the VSS line constituting the ground node VSS, the configuration is not limited to this. For example, in place of the VDD line, another line capable of shielding noise between the transmission line and the VSS line may be laid. Otherwise, in place of laying the VDD line, the distance between the transmission line and the VSS line may be made large to the extent that crosstalk can be prevented appropriately.

In the above embodiment, while the filter unit 41 includes the switch control part 43, the configuration is not limited to this. For example, the switch control part 43 may be provided outside the loop filter 4 or may be configured as part of the switch part 44.

According to the loop filter of the present disclosure, while the PLL using the loop filter is made able to respond to a wide input frequency range and a wide output frequency range, fluctuations in oscillating frequency due to power supply noise and/or ground noise can be prevented. The present disclosure is therefore very useful.

The invention claimed is:

1. A loop filter used for a PLL, comprising:
   an input terminal and an output terminal mutually connected via a first node;
   a filter unit provided between the first node and a first power supply terminal, the filter unit including at least one first resistive element, at least one first capacitive element, and a switch part; and
   a low pass filter provided between a second power supply terminal and a third power supply node,
wherein
   one or more of the at least one first resistive element and the at least one first capacitive element are provided between the first node and the first power supply terminal via the switch part, and at least either a resistance value or a capacitance value of the filter unit is variable with on/off of the switch part, and
   the switch part is constituted by transistors, and a backgate of at least one of the transistors is connected to the third power supply node.

2. The loop filter of claim 1, wherein
   a well on which the transistor having the backgate connected to the third power supply node is formed is isolated from a well or a substrate on which other transistors constituting the loop filter are formed.

3. The loop filter of claim 1, wherein
the low pass filter is an RC filter using a second resistive
element connected between the second power supply
terminal and the third power supply node and a second
capacitive element connected between the third power
supply node and the first power supply terminal, and
at least either a resistance value of the second resistive
element or a capacitance value of the second capacitive
element is variable.

4. The loop filter of claim 1, wherein
a shield line is laid between a second power supply
connected to the second power supply terminal and the
first node.

5. The loop filter of claim 1, wherein
the at least one first capacitive element includes a third
capacitive element, a fourth capacitive element, and a
fifth capacitive element, and
a serial circuit of the switch part and the third capacitive
element, a serial circuit of the first resistive element and
the fourth capacitive element, and the fifth capacitive
element are connected in parallel between the first node
and the first power supply terminal.

6. The loop filter of claim 5, wherein
the filter unit includes a plurality of serial circuits each
made of the switch part and the third capacitive ele-
ment, and the plurality of serial circuits are connected
in parallel between the first node and the first power
supply terminal.

7. The loop filter of claim 1, wherein
the at least one first resistive element includes a third
resistive element and a fourth resistive element,
the at least one first capacitive element includes a third
capacitive element, a fourth capacitive element, and a
fifth capacitive element, and
a serial circuit of the switch part, the third capacitive
element, and the third resistive element, a serial circuit
of the fourth resistive element and the fourth capacitive element, and the fifth capacitive element are connected
in parallel between the first node and the first power
supply terminal.

8. The loop filter of claim 7, wherein
the filter unit includes a plurality of serial circuits each
made of the switch part, the third capacitive element,
and the third resistive element, and the plurality of
serial circuits are connected in parallel between the first
node and the first power supply terminal.

9. The loop filter of claim 1, wherein
a source of the transistor having the backgate connected
to the third power supply node is connected to the third
power supply node.

10. A PLL comprising:
a phase comparator comparing an external clock signal
received externally with a feedback clock signal;
a charge pump performing charge pumping operation in
response to a phase comparison result from the phase
comparator;
the loop filter of claim 1 converting an output of the
charge pump into a control voltage;
a voltage controlled oscillator receiving the control volt-
age as an input voltage and outputting an oscillation
signal responsive to the control voltage; and
a frequency divider dividing a frequency of the oscillation
signal output from the voltage controlled oscillator and
outputting the result as the feedback clock signal.

11. The PLL of claim 10, wherein
the voltage controlled oscillator includes
    a current source generating an operating current from
    the control voltage, and
    a ring oscillator changing an oscillating frequency of
    the oscillation signal in response to the operating
    current supplied from the current source, and
the current source is a variable current source in which the
operating current changes based on a current control
signal.

* * * * *